United States Patent [19]

Ogura et al.

[11] Patent Number: 4,907,030
[45] Date of Patent: Mar. 6, 1990

[54] IMAGE FORMATION APPARATUS WITH A CARTRIDGE FOR A ROLL OF PHOTOSENSITIVE SHEET

[75] Inventors: Mitsuru Ogura; Shougo Iwai, both of Nara, Japan

[73] Assignee: Sharp Kabushiki Kaisha, Osaka, Japan

[21] Appl. No.: 233,159

[22] Filed: Aug. 17, 1988

[30] Foreign Application Priority Data

Aug. 25, 1987 [JP] Japan ................................. 62-210895
Aug. 25, 1987 [JP] Japan ................................. 62-210896

[51] Int. Cl.⁴ .................... G03B 27/58; G03B 1/04; G11B 15/32
[52] U.S. Cl. ..................................... 355/72; 242/199; 352/78 R; 352/158; 354/275; 355/64
[58] Field of Search ................ 358/64, 72; 354/275; 242/197, 199, 157 R; 252/78 R, 158

[56] References Cited

U.S. PATENT DOCUMENTS 3,722,988  3/1973  Neudecker ................ 352/158 X
3,764,088  10/1973  Yamada et al. ........... 352/158 X
4,340,292  7/1982  Koch et al. ................... 354/275

Primary Examiner—Richard A. Wintercorn
Attorney, Agent, or Firm—Flehr, Hohbach, Test, Albritton & Herbert

[57] ABSTRACT

An image formation apparatus has a detachably attached cartridge having a box for containing a roll of unused photosensitive sheet and a take-up shaft which is unistructurally formed with the box and serves to wrap up the used part of the photosensitive sheet. Holding plates which serve to guide the used part of the photosensitive sheet towards the take-up shaft are pressed against the take-up shaft automatically when a cover for the cartridge is opened.

10 Claims, 16 Drawing Sheets

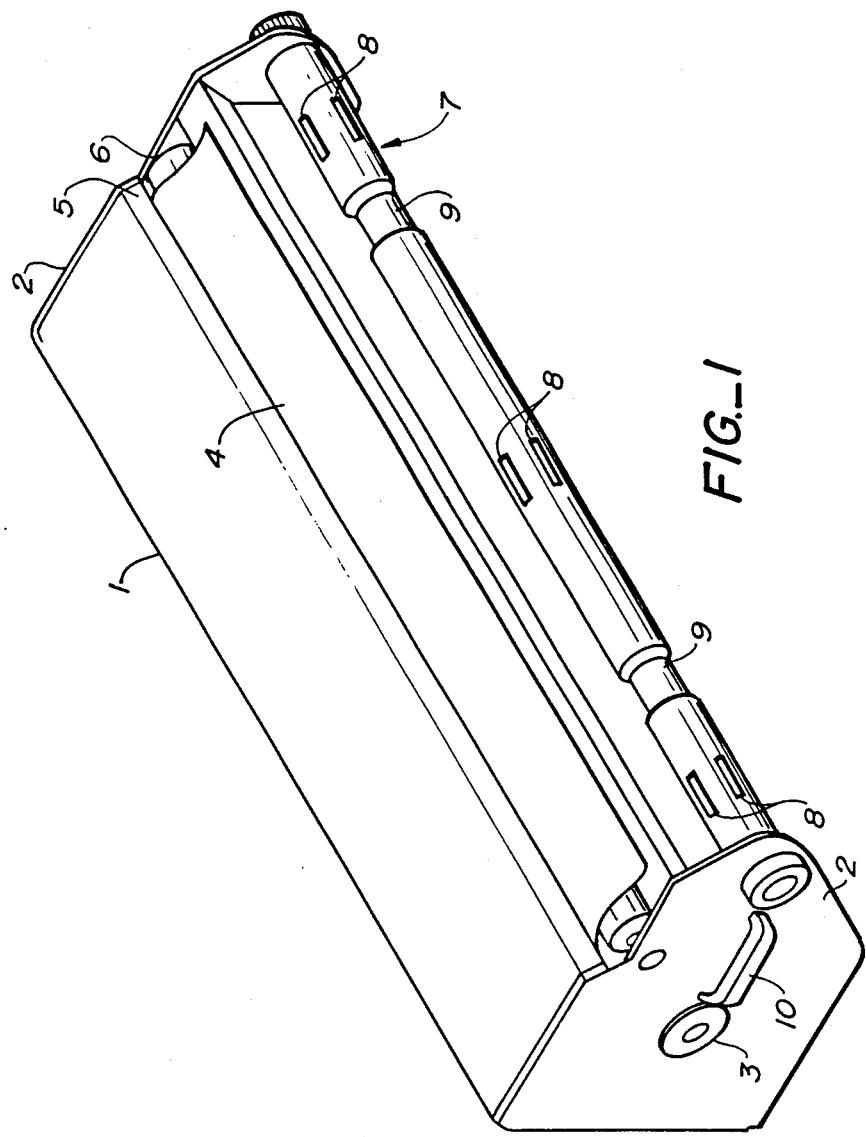
FIG._1

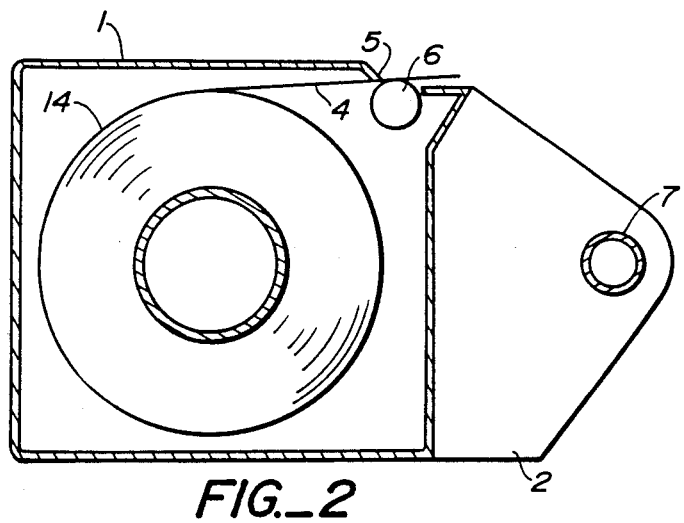
FIG._2
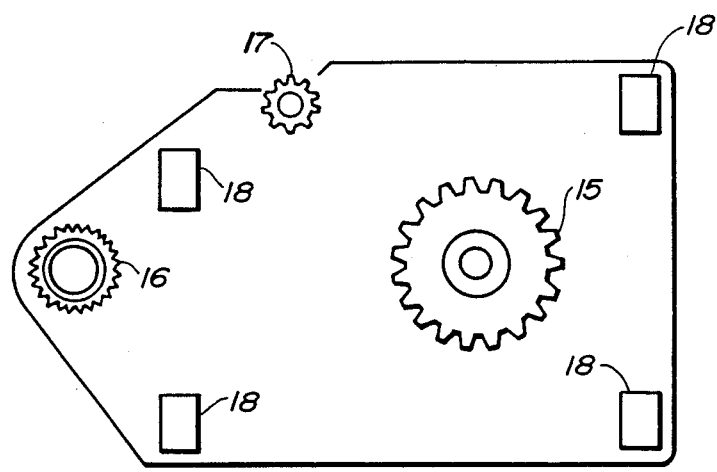
FIG._3

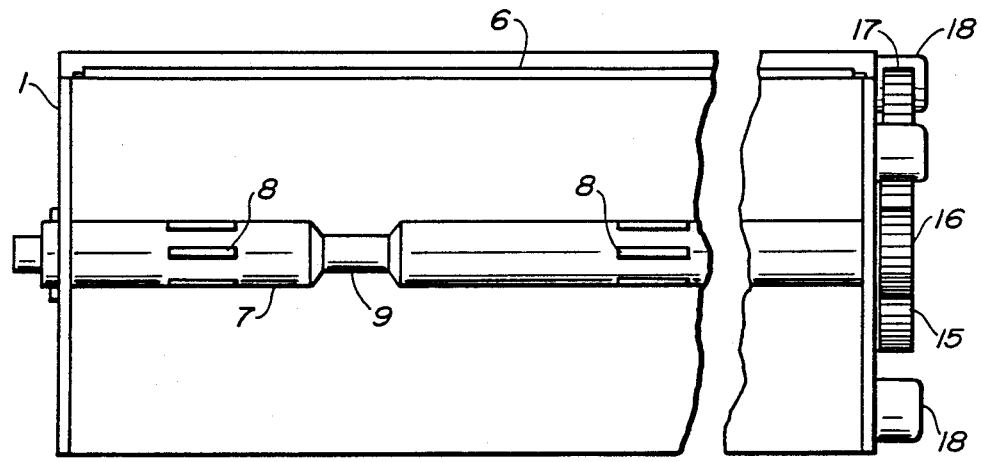
FIG._4
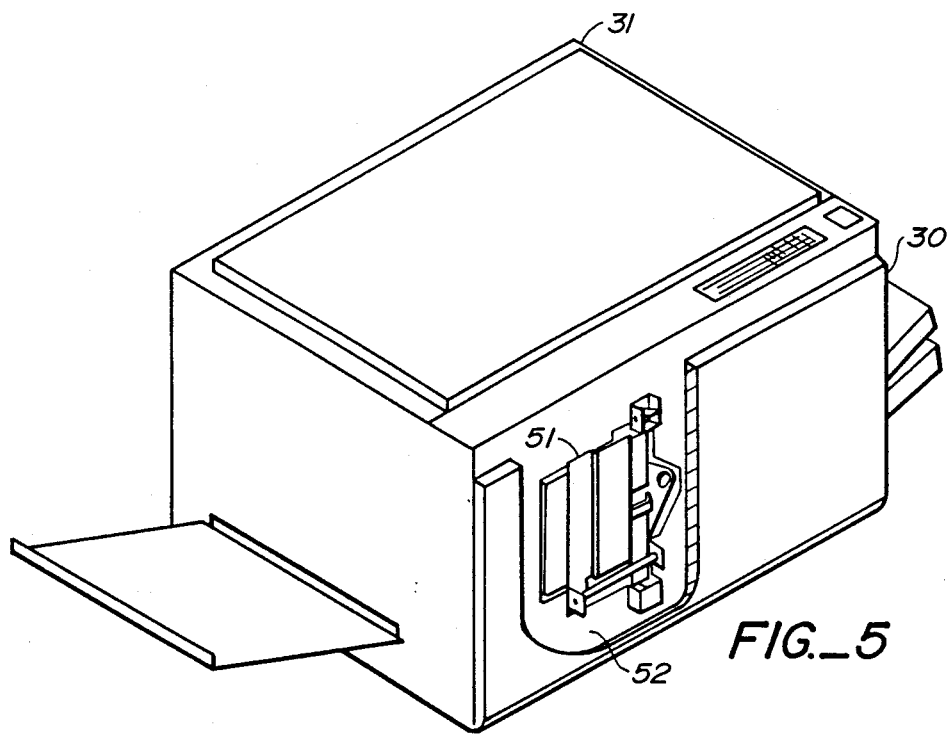
FIG._5

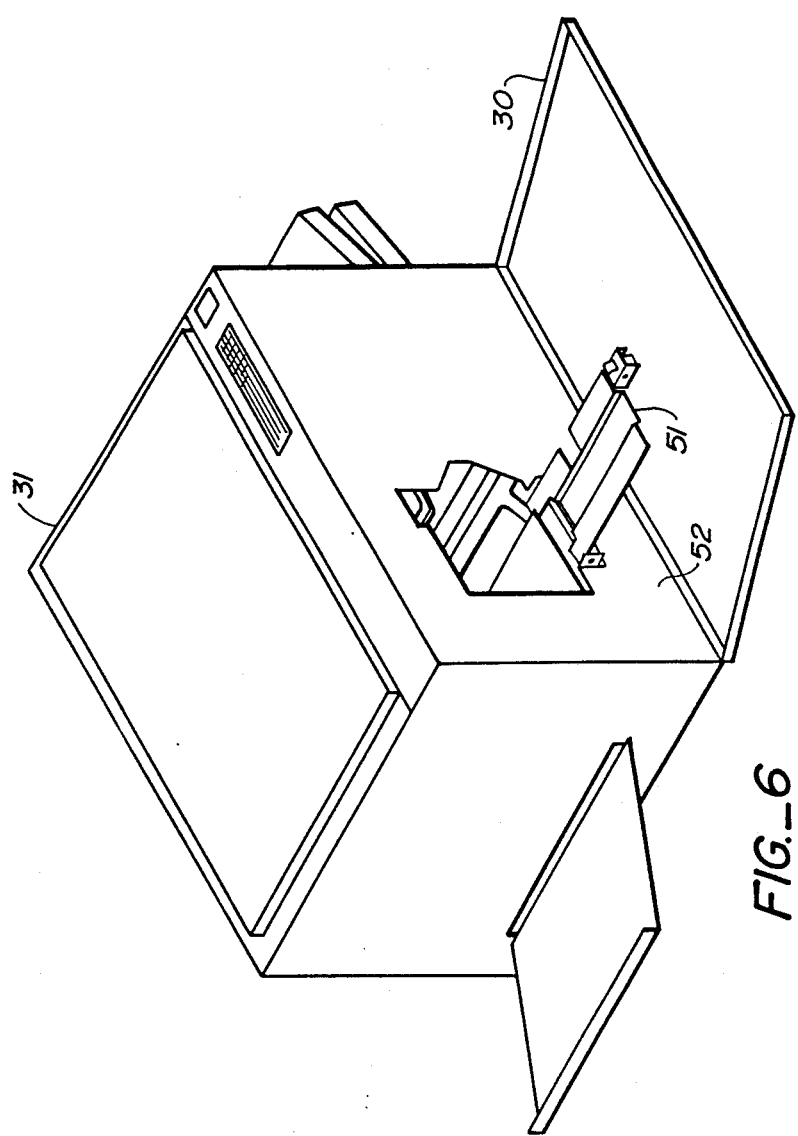
FIG._6

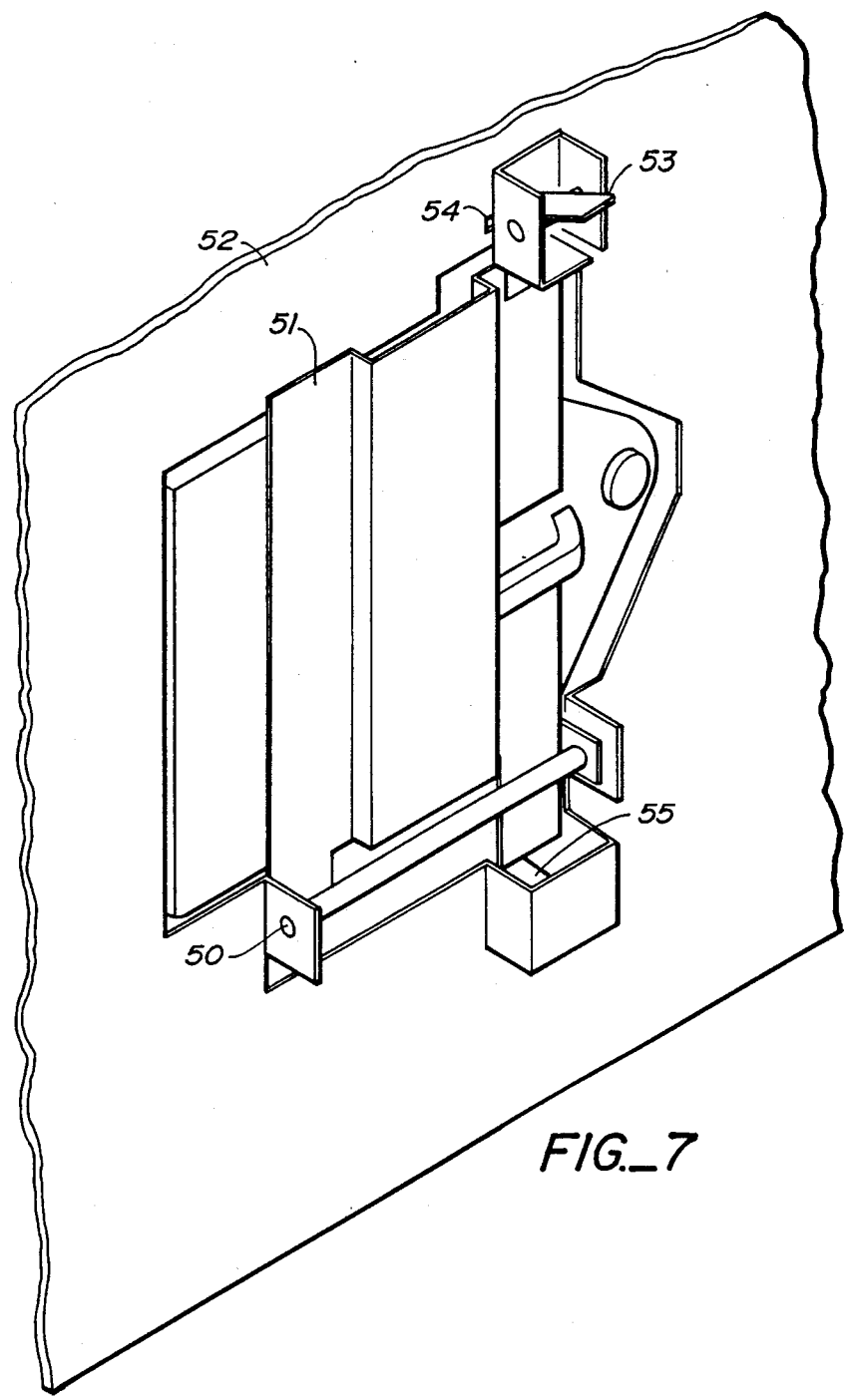
FIG._7

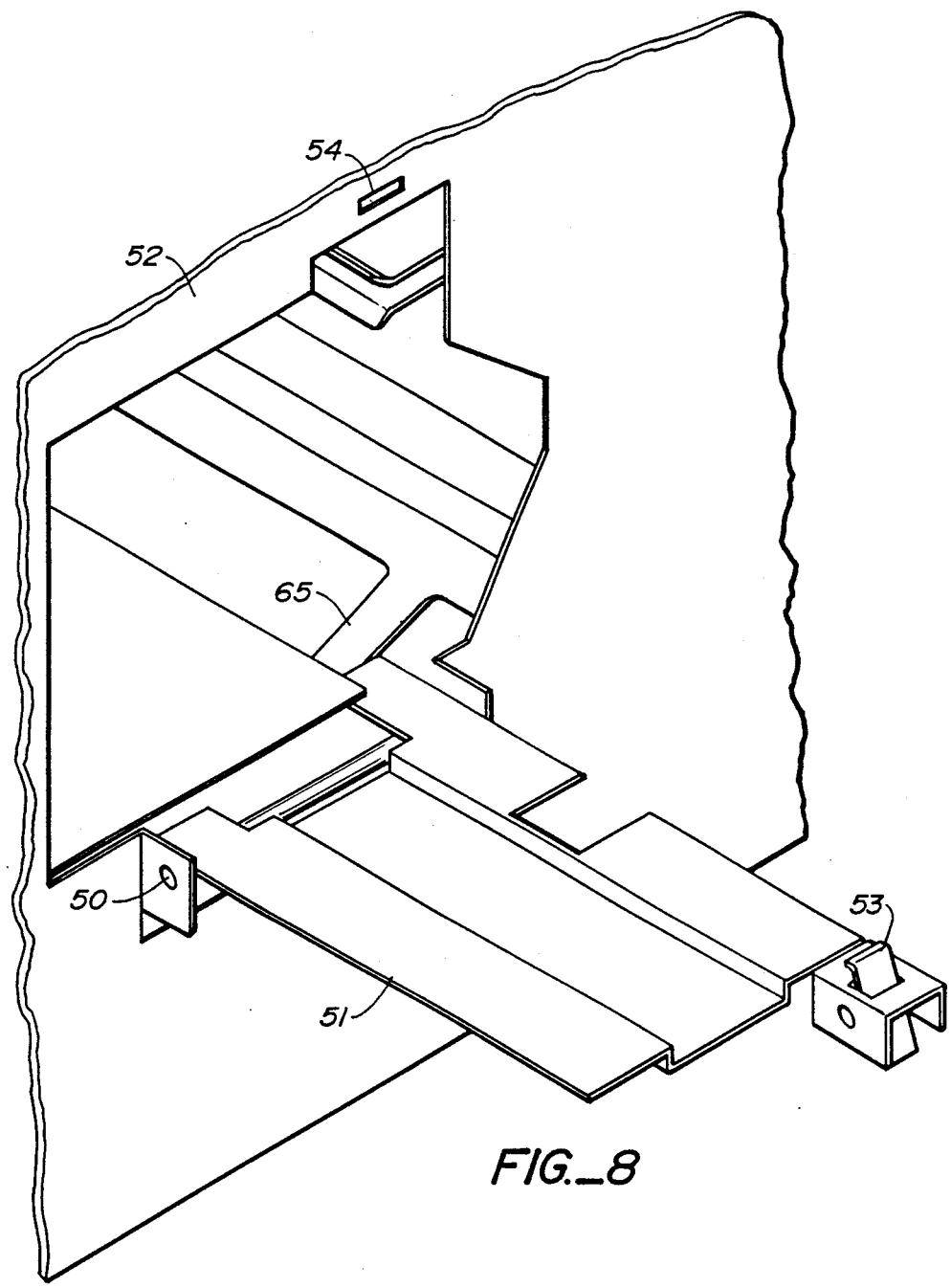
FIG._8

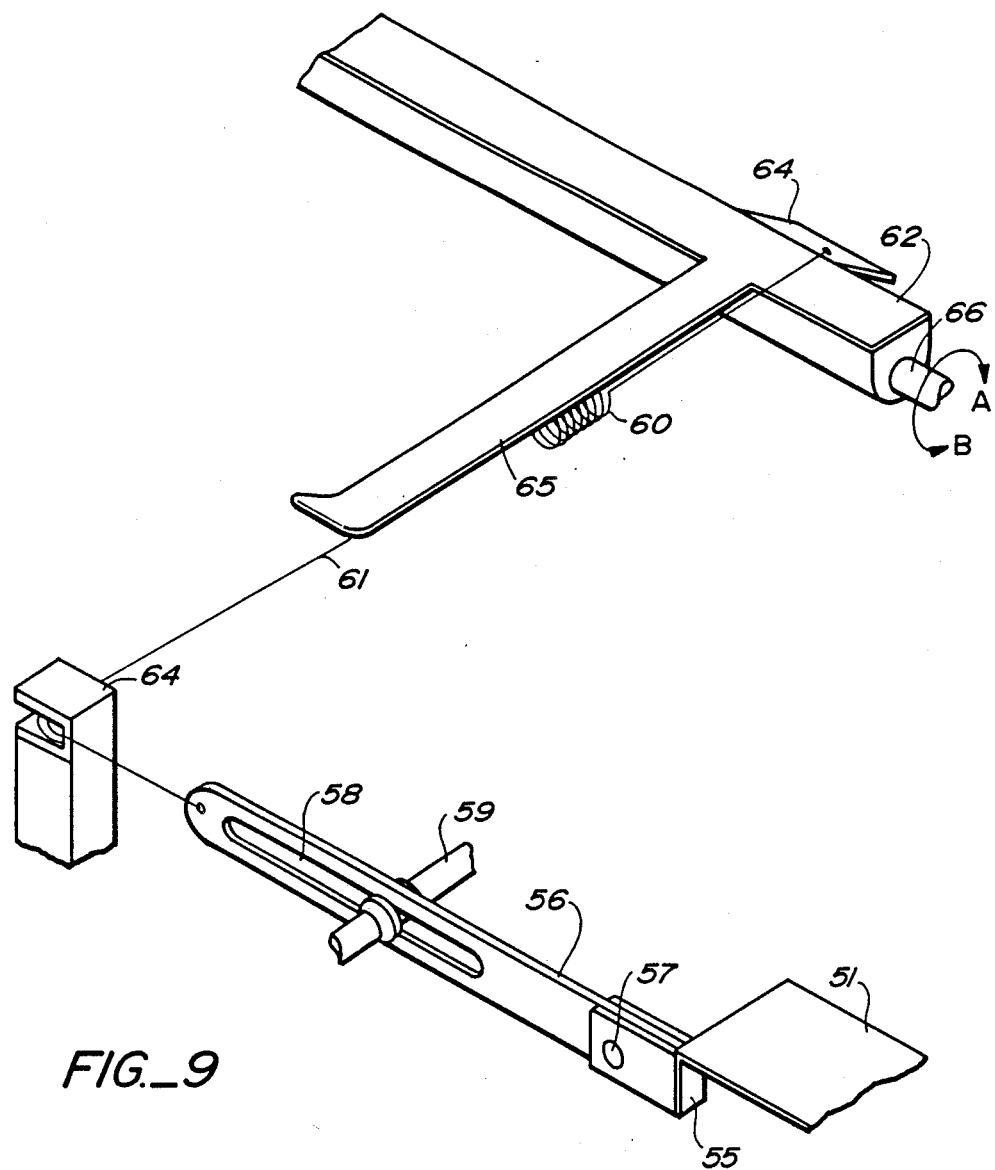
FIG._9

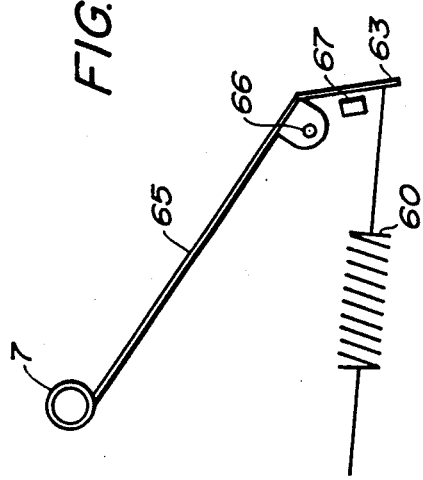
FIG._10B
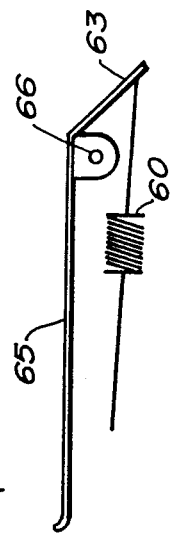
FIG._11B
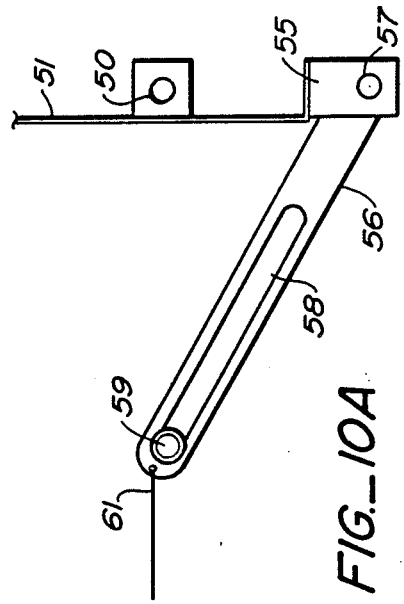
FIG._10A
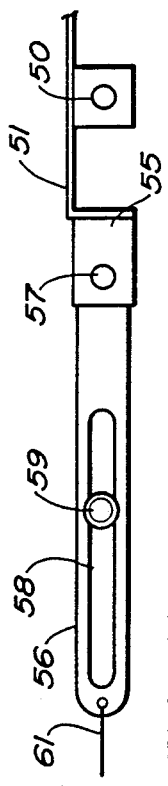
FIG._11A

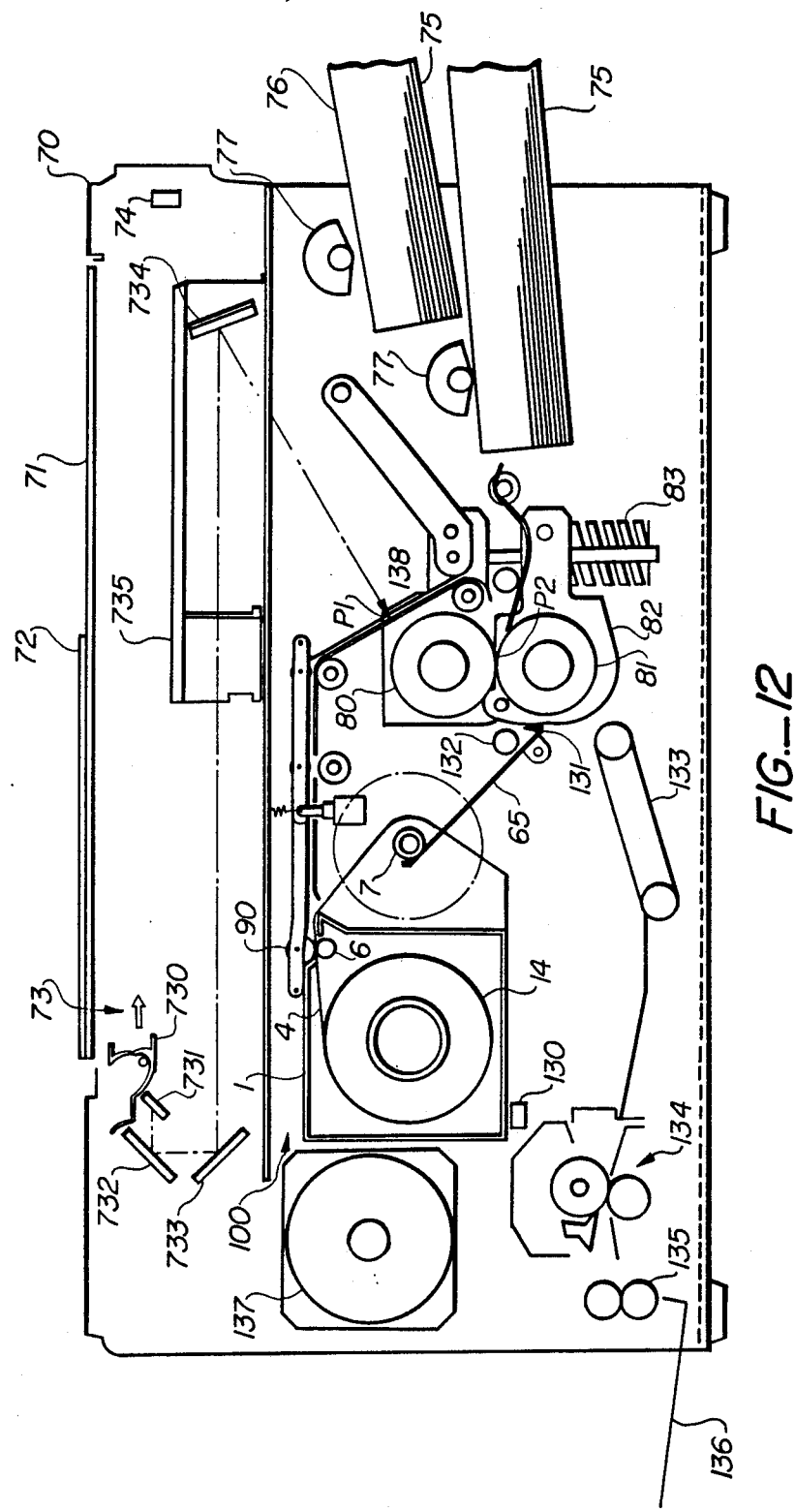
FIG._12

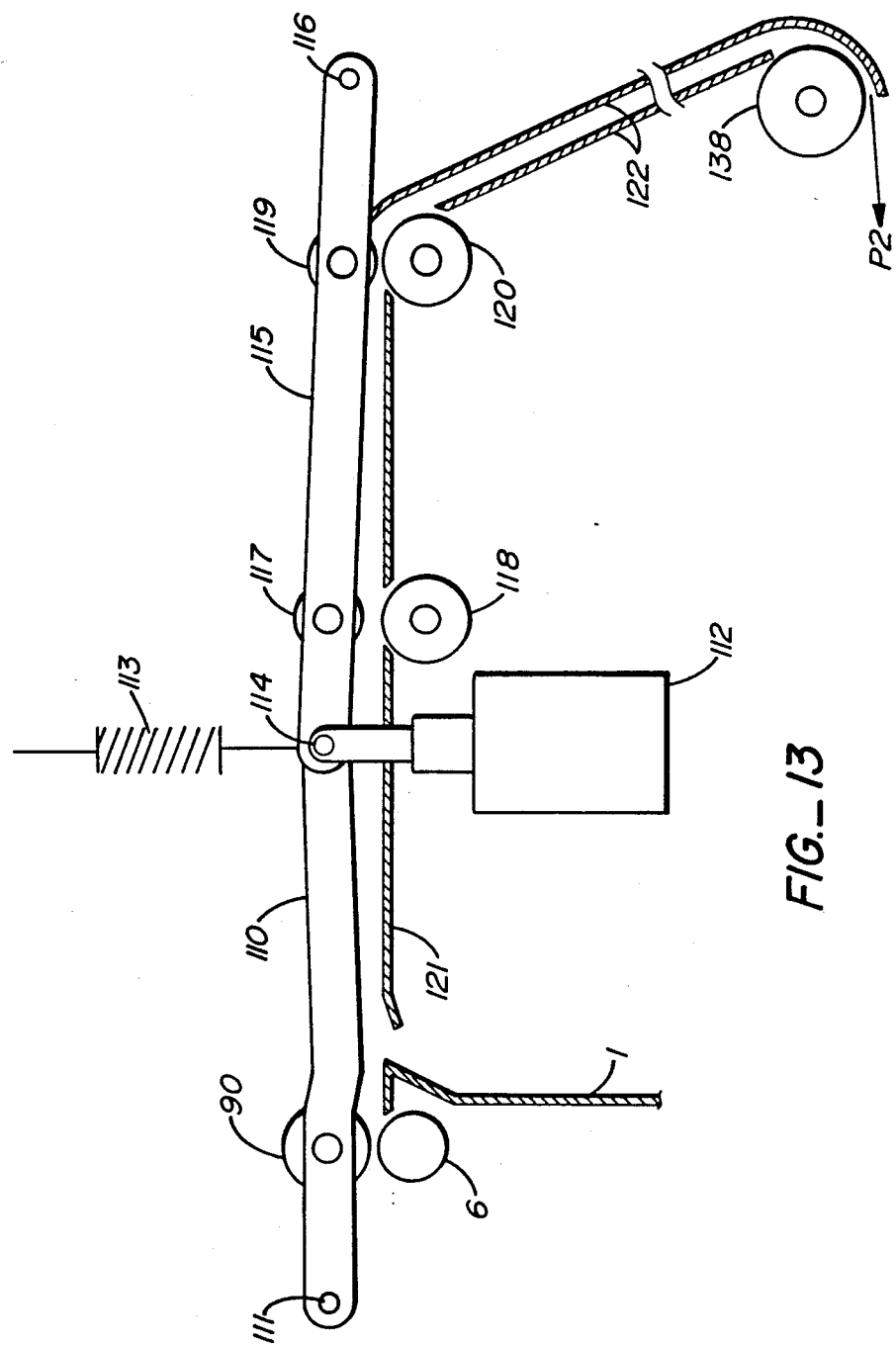
FIG._13

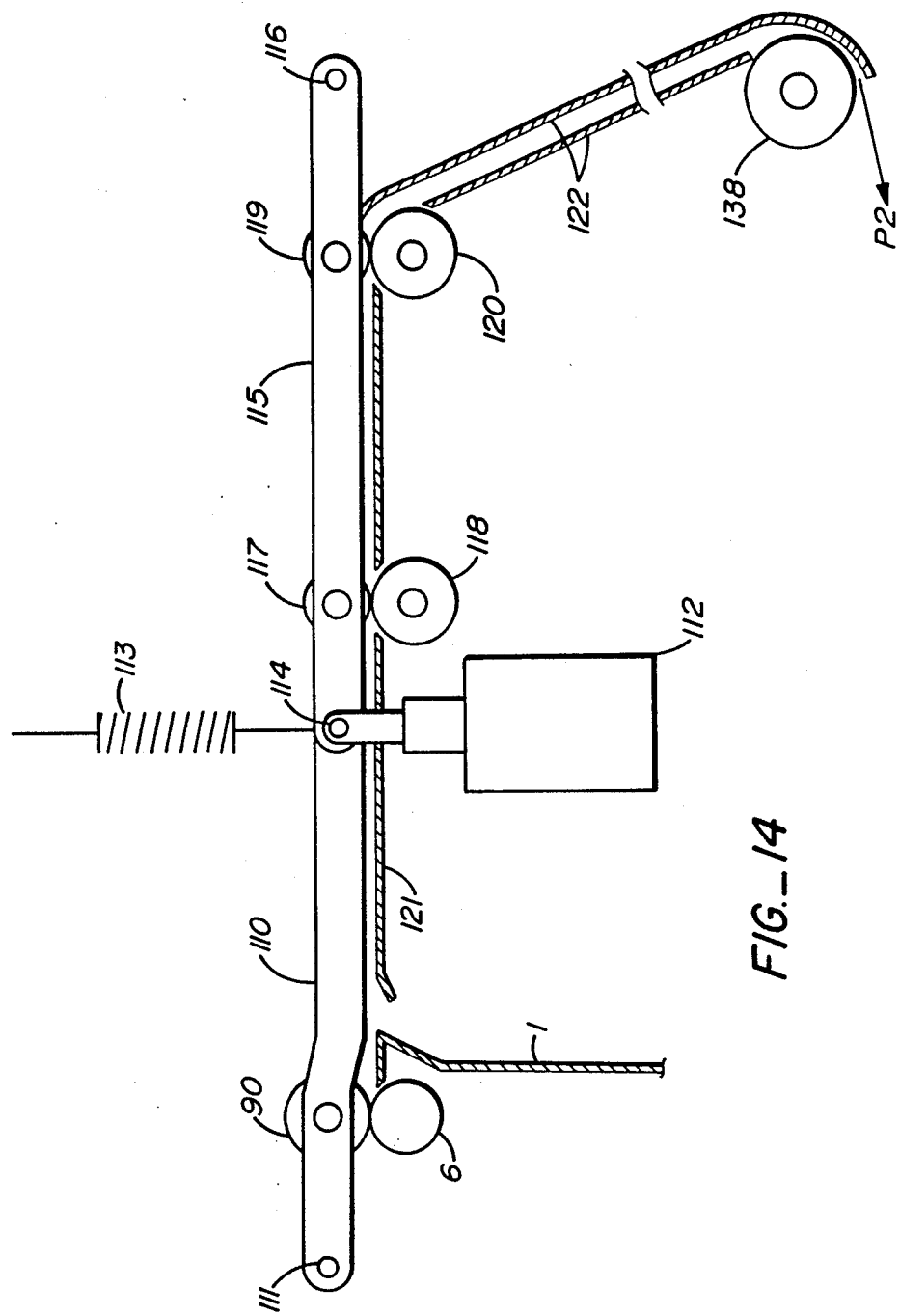

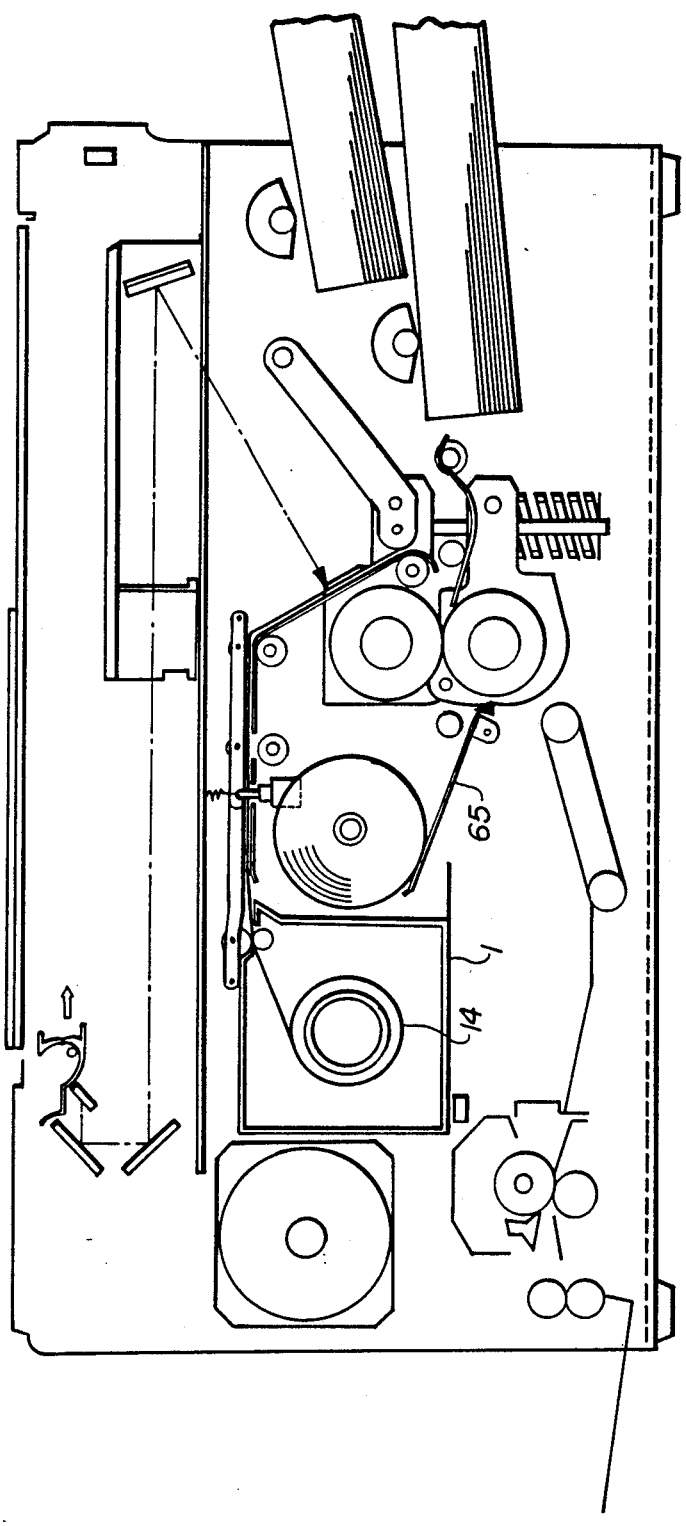
FIG._15

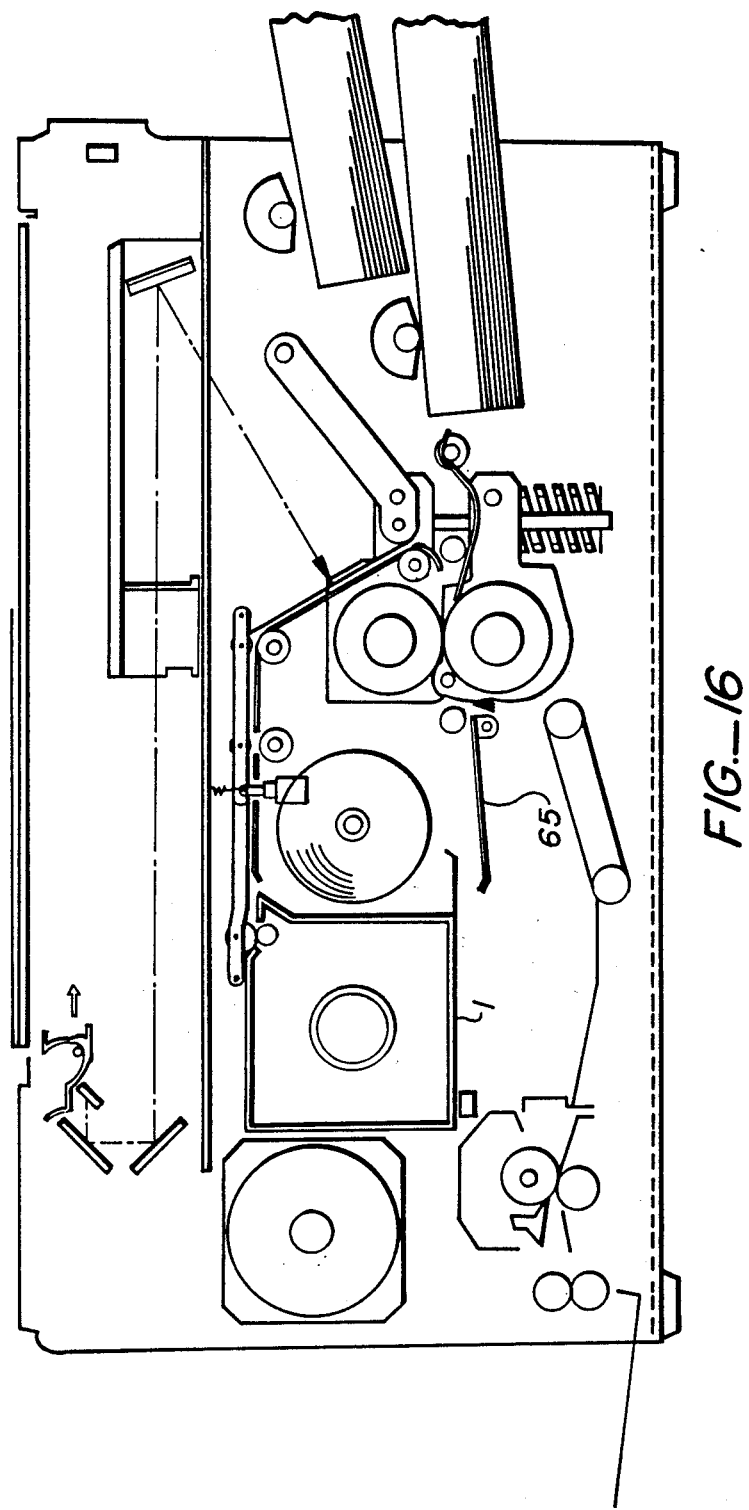
FIG.—16

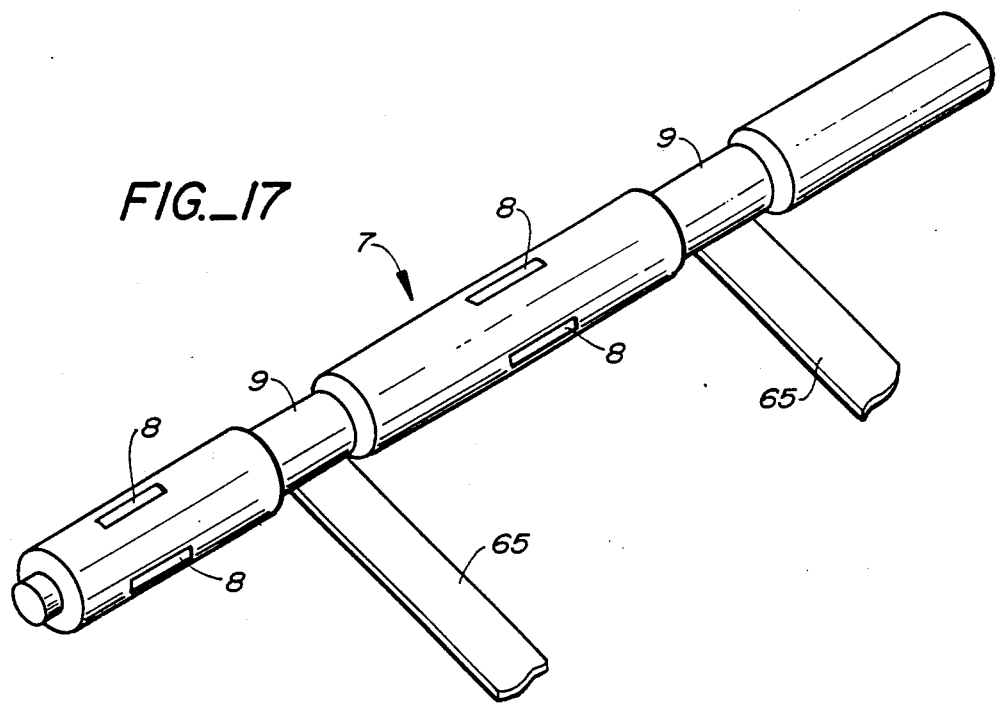
FIG._17
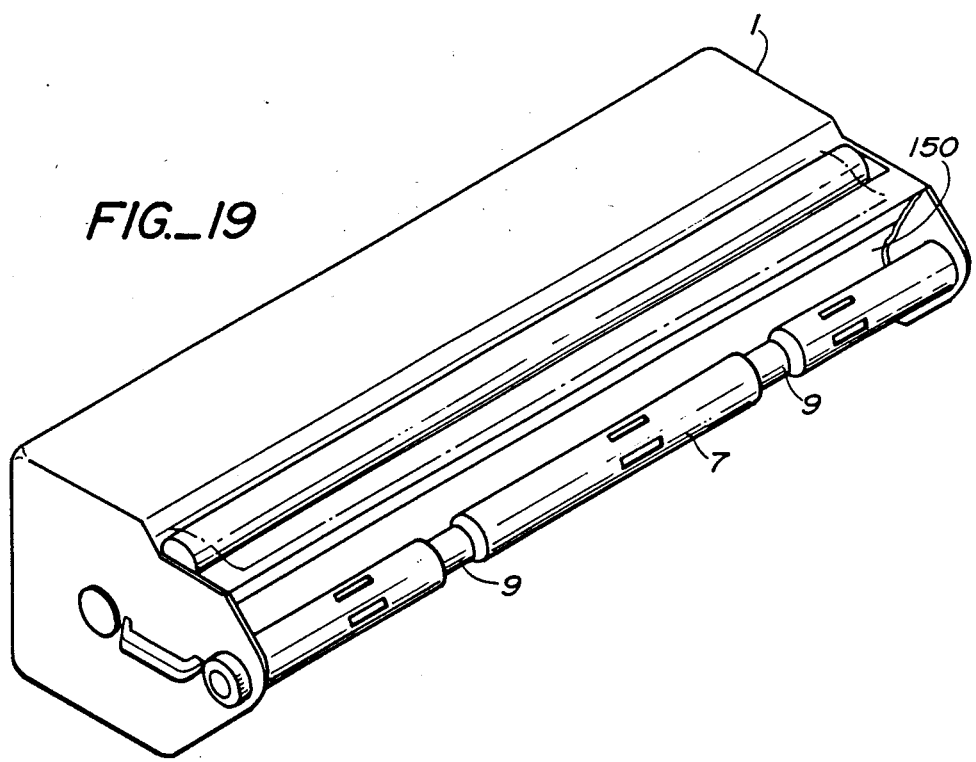
FIG._19

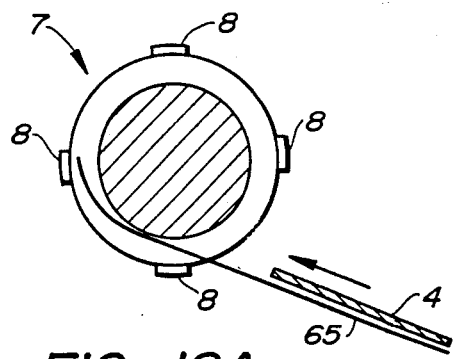
FIG._18A
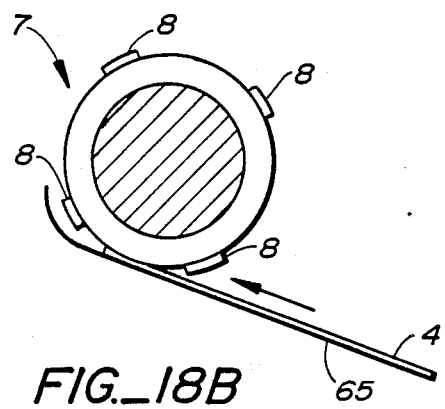
FIG._18B
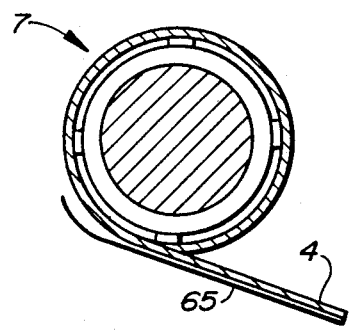
FIG._18C

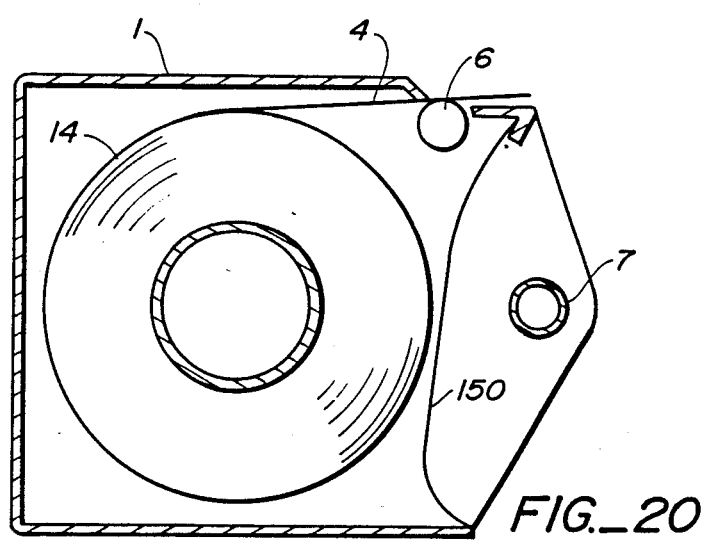
FIG._20
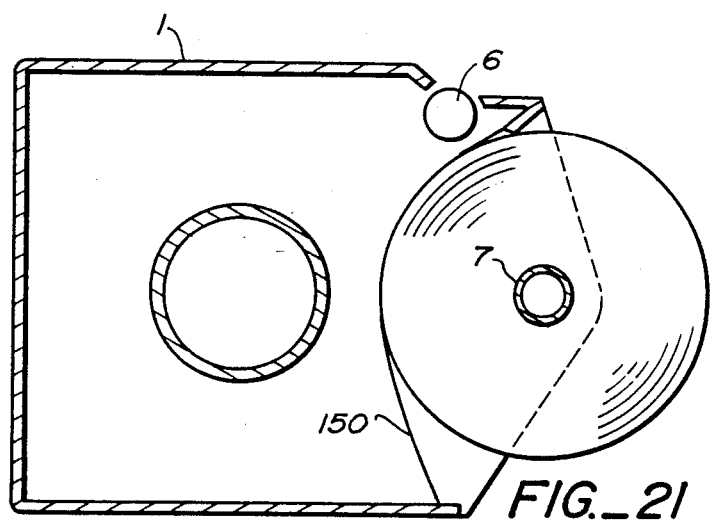
FIG._21

IMAGE FORMATION APPARATUS WITH A CARTRIDGE FOR A ROLL OF PHOTOSENSITIVE SHEET

BACKGROUND OF THE INVENTION

This invention relates to an image formation apparatus with a cartridge for housing a roll of photosensitive sheet.

Of particular interest for application of this invention are photosensitive sheets of the type disclosed, for example, in U.S. Pat. No. 4,399,209 (Japanese Patent Publication Tokkai No. 58-88739) comprised of a flexible base sheet coated with microcapsules encapsulating a colorless dye and a photopolymerizing agent which hardens by exposure to light. When a photosensitive sheet like this is exposed to an image forming beam of light such as reflected light from an original document to be copied, those of the microcapsules exposed to light harden while those not exposed remain soft such that an invisible image, or a pattern, of selectively hardened microcapsules is formed on the sheet. A visible image can be obtained from such an invisible image by superposingly covering the invisible pattern with an image transfer sheetcoated with a developer material and pressing them together such that only those of the microcapsules which are not hardened by exposure to light are ruptured, causing the encapsulated colorless dye to flow out. The developer material is so selected as to have a chromogenic effect on the dye encapsulated in the microcapsules. Thus, the dye flowing out of the ruptured microcapsules becomes visible, producing a visible image on the transfer sheet.

In an image formation process of this type, it is important to protect the surface of the photosensitive sheet coated with microcapsules not only against external light but also against external force before it is exposed to the image forming beam of light because an external force may rupture the microcapsules. One method of achieving this is to prepare the photosensitive sheet in the form of a roll and set it inside the housing structure of the image formation apparatus. An additional advantage of preparing the photosensitive sheet in a rolled form is that it can then be directly wound around a cylindrical drum on the surface of which an exposure point is defined by an optical system. In this manner, the photosensitive sheet can be supplied and transported by the rotation of this drum and feeding rollers and the like for transporting cut sheets from a cassette can be dispensed with. In other words, the coated surface of the photosensitive sheet can be protected against frictional force of these rollers. If the sheet is rolled up and set inside the housing structure, furthermore, it can also be safely protected against exposure to external light.

A rolled photosensitive sheet, however, risks the danger of exposure to light before it is set inside the housing structure of the image formation apparatus. Moreover, a roll of photosensitive sheet to be directly set inside the image formation apparatus is not easy to work with. Thus, there have been ideas of providing a detachably attachable cartridge inside an image formation apparatus for supporting such a roll of photosensitive sheet. With a cartridge of a simple type intended only for protectingly containing an unused roll of photosensitive sheet, however, there still remains the disposal problem of the used part of the sheet because the photosensitive sheet of this type, unlike the photoreceptor of an electrophotographic copier, is not intended to be used over and over again and the used part must be discarded. There has been the idea of cutting off the used part after each copying and throwing it away but it is not convenient for the user if the used part must be discarded after each copy of made. There has also been the idea of providing a shredder to shred the used part after each copying but neither is it convenient because the image formation apparatus would be required to have an accordingly larger housing structure to contain such a shredder inside and also because the user would still have to throw away the shredded pieces from time to time.

SUMMARY OF THE INVENTION

It is therefore an object of the present invention to provide an image formation apparatus with a cartridge for containing therein a roll of photosensitive sheet, adapted also to collect thereinto the used part of the sheet such that the operator's work is simplified and the image formation apparatus can be compactly designed.

The above and other objects of the present invention can be achieved by providing an image formation apparatus with a detachably attached cartridge characterized as having a box for containing therein a roll of unused photosensitive sheet and a take-up shaft which is unistructurally formed with the box and serves to wind up the used part of the photosensitive sheet. What are herein referred to as holder plates are provided not only to hold the used part of the photosensitive sheet against the take-up shaft but also to guide it towards the take-up shaft. They are in motion-communicating relationship with a cover such that they are pressed against the take-up shaft when the cover is closed but become separated therefrom when the cover is opened. With a cartridge thus formed, the used part of the photosensitive sheet originally stored in its box is sequentially wound up around the take-up shaft, guided by the holder plates and passing between the take-up shaft and the holder plates. The cartridge is exchanged with a new one when the photosensitive sheet is all used up and completely wound up.

BRIEF DESCRIPTION OF THE DRAWINGS

The accompanying drawings, which are incorporated in and form a part of the specification, illustrate embodiments of the present invention and, together with a description, serve to explain the principles of the invention. In the drawings, FIG. 1 is a diagonal external view of a cartridge for an image formation apparatus embodying the present invention for containing therein a roll of photosensitive sheet, FIG. 2 is a sectional front view of the cartridge of FIG. 1, FIG. 3 is a bottom view of the cartridge of FIG. 1, FIG. 4 is a back view of the cartridge of FIG. 1, FIG. 5 is a diagonal external view of the image formation apparatus, showing in articular its portion where the cartridge of FIG. 1 is mounted, FIG. 6 is a diagonal external view of the image formation apparatus of FIG. 5 when its front and cartridge covers are opened, FIGS. 7 and 8 are diagonal external views of the cartridge cover of FIGS. 5 and 6 when it is closed and opened, respectively, FIG. 9 is a diagonal external view of the mechanism for operating the holder plates of the image formation apparatus of FIGS. 5 and 6, FIGS. 10A and 10B are drawings for showing the operation of the holder plates when the cartridge cover of FIGS. 7 and 8 is closed, FIGS. 11A and 11C are drawings for showing the operation of the holder plates when the cartridge cover of FIGS. 7 and 8 is open, FIG. 12 is a sectional front view of the image formation apparatus of FIGS. 5 and 6 when the cartridge of FIG. 1 is mounted, FIGS. 13 and 14 are drawings showing the transportation route for the photosensitive sheet in the image formation apparatus of FIG. 12 when the rollers are separated and contacted, respectively, FIG. 15 is a sectional front view of the image formation apparatus of FIG. 12 when the roll of photosensitive sheet is partially wound up, FIG. 16 is a sectional front view of the image formation apparatus of FIGS. 12 and 15 when the roll of a photosensitive sheet has been completely used up and the front cover and cartridge cover have been opened, FIG. 17 is a diagonal external view of the take-up shaft in relationship to the holder plates, FIGS. 18, 18B and 18C are drawings for showing the process of winding up the front edge of the photosensitive sheet around the take-up shaft, FIG. 19 is a diagonal external view of another cartridge for an image formation apparatus embodying the present invention for containing therein a roll of photosensitive sheet, FIG. 20 is a sectional front view of the cartridge of FIG. 19 when no part of the photosensitive sheet is taken up yet, and FIG. 21 is a sectional front view of the cartridge of FIGS. 19 and 20 when the photosensitive sheet has been completely wound up.

DETAILED DESCRIPTION OF THE INVENTION

A cartridge for an image formation apparatus embodying the present invention is described with reference to FIG. 1 which is its overall external view, FIG. 2 which is its frontal sectional view, FIG. 3 which is its back view and FIG. 4 which is its right-hand side view. The roll of photosensitive sheet to be contained in the cartridge may be of the type disclosed in U.S. Pat. No. 4,399,209 (Japanese Patent Publication Tokkai No. 58-88739) comprised of a flexible base sheet coated with microcapsules encapsulating a colorless dye and a photopolymerizing agent which hardens upon exposure to light. Image transfer sheets with a base sheet coated with a developer material having a chromogenic effect on the aforementioned colorless dye are intended to be used with such a photosensitive sheet.

A box 1 is provided for containing therein a roll of unused photosensitive sheet 4. Front and back frames 2 of the box 1 support a shaft 3 rotatably and the photosensitive sheet 4 is wound around the shaft 3 such that its photosensitive (or microcapsule-coated) surface faces the outward direction. The photosensitive sheet 4 has a leader section of a length of about 10–20 cm from its front end made of a relatively stiff material so that it can be easily transported by rollers as will be explained more fully below. The box 1 is also provided with a take-up shaft 7 for taking up the used part of the photosensitive sheet 4. The take-up shaft 7 is also supported rotatably by the front and back frames 2 of the box 1 and a driver gear is attached to one end thereof as will be explained more fully below.

Several adhesive sections 8 are provided on the circumference of the take-up shaft such that the front end of the used part of the photosensitive sheet can be attached to the take-up shaft 7 easily. The take-up shaft 7 is also provided with grooves 8 at positions corresponding to holder plates to be described below which are attached to the housing structure of the image formation apparatus inside which this cartridge is set.

The front one of the aforementioned frames 2 of the box is provided with a handle 1 to be used when this cartridge is attached to the housing structure. The back frame is provided with gears 15, 16 and 17 as best shown in FIG. 3 for communicating power from the main body of the apparatus to the shafts 3 and 7 and a roller to be described below for pulling the photosensitive sheet out of the box 1. Four protrusions 18 are also provided on the back frame both for protecting the gears 15-17 and for correctly positioning the cartridge when it is mounted.

Since the take-up shaft 7 is exposed to the exterior, it is preferable to further provide a cover sheet or the like to prevent dust particles from becoming attached to the adhesive sections 8 when it is being transported. Alternatively, the take-up shaft 7 may be designed to serve as a handle when the cartridge is being transported.

FIGS. 5 and 6 show the mechanism by which the cartridge described above is set inside the housing structure 31 of the image formation apparatus. In FIGS. 5 and 6, numeral 30 indicates a front cover of the image formation apparatus openably attached to the front side of the housing structure 31. When this front cover 30 is opened in the forward direction, a front frame 52 of the housing structure 31 becomes exposed and the cartridge is set to the left-hand side of this front frame. Numeral 51 indicates a cartridge cover for holding the cartridge inside the housing structure 31. FIGS. 7 and 8 show this cartridge cover 51 more in detail when it is closed and opened, respectively.

A shaft 50 is affixed to the lower left-hand side of the aforementioned front frame of the housing structure 31 and rotatably support this cartridge cover 51. An attaching device 53 for attaching the cartridge cover 51 to the front frame 52 of the housing structure 31 is provided at the upper right-hand side of the cartridge cover 51. Correspondingly thereto, a hole 54 is formed in the front frame 52 of the housing structure 31 to engage with the aforementioned attaching device 53. The right-hand lower end of the cartridge cover 51 is extended downward and its end part is bent to an L-shape to form a fastening piece 55. Operation of the aforementioned holder plates in connection with this fastening piece 55 is explained next by way of FIG. 9.

As shown in FIG. 9, the aforementioned fastening piece 55 is attached to an angle which is connected to an arm 56 through an axis 57. This arm 56 has an elongated hole 58 therethrough and a shaft 59 affixed to the housing structure penetrates this elongated hole 59. One end of the arm 26 (distal from the L-shaped fastening piece 55) is attached to a wire 61 connected to a spring 60, the other end of which is attached to a protrusion 63 from a supporting plate 62 with which aforementioned holder plates (indicated at 65) are unistructurally formed. Numeral 64 indicates a wire-supporting member formed as a part of the housing structure. The holder plates 65 are mutually separated such that each of them engages with one of the grooves 9 formed on the take-up shaft 7 when the cartridge is set to the housing structure. The supporting plate 62 is supported rotatably around another shaft 66.

When the cartridge cover 51 is closed as shown in FIG. 7, the arm 56 is moved far to the right such that the penetrating shaft 59 is at the left-hand corner of the elongated hole 58 as shown in FIG. 10A and the wire 61 is accordingly pulled to the right. Since the spring 60 is also pulled by this wire 61 as shown in FIG. 10B, the supporting plate 62 rotates around the shaft 66 in the direction of the arrow A shown in FIG. 9. This causes the holder plates 65, unistructurally formed with this supporting plate 62, to also rotate in the direction of the arrow A and their front ends come to engage with the grooves 9 formed on the take-up shaft 7 of the cartridge as shown in FIG. 10B.

If, on the other hand, the attaching device 53 is removed from the corresponding hole 54 when the cartridge 51 is in the closed condition as shown in FIG. 7 and the cartridge 51 is pulled forward to the horizontal open position as shown in FIG. 8, the arm 56 moves accordingly to the left as shown in FIG. 11A and releases the spring 60 from its stretched condition through the wire 61 attached thereto. As a result, the supporting plate 62 rotates in the direction of the arrow B in FIG. 9 and the holder plates 65 are separated from the grooves 9 of the take-up shaft 7 as shown in FIG. 11B. In summary, the holder plates 65 are adapted to automatically engage in the grooves 9 of the cartridge when the cartridge cover 51 is closed and to automatically disengage therefrom when the cartridge cover 51 is opened.

When it is desired to mount a cartridge, the cartridge cover 51 is opened as shown in FIG. 8 to expose the front frame 52 of the housing structure. After the cartridge is fully inserted into housing structure of the image formation apparatus, the cartridge cover 51 is closed as shown in FIG. 7, thereby causing the holder plates 65 to engage with the grooves 9 on the take-up shaft 7 of the cartridge as explained above. In FIG. 10B, numeral 67 indicates a stopper serving to prevent the holder plate 65 from rotating excessively when they engage with the grooves 9. In summary, these holder plate 65 do not obstruct the cartridge when it is inserted into the housing structure because they are automatically moved away from the position of the cartridge as the cartridge cover 51 is opened to admit the cartridge but, as soon as the cartridge is mounted and the cartridge cover 51 is closed, they serve to hold the used part of the photosensitive sheet against the take-up shaft 7 as will be explained more fully below.

FIG. 12 shows the entirety of the image formation apparatus when the cartridge is installed into the housing structure. At the top of its main body 70, there is a document table 71 for placing thereon an original document 72 to be copied. Below the document table 71 is an optical system 73 of a known type, comprised of a light source 730, four reflective mirrors 731-734 and a lens 735 and adapted to move in the direction of the arrows shown to scan the document 72. A front cover detector switch 74 is provided at an upper right-hand part of the main body 70 and is switched on when the front cover 30 (shown in FIGS. 5 and 6) is closed.

On the right-hand side of the main body 70 are two paper supply cassettes 75 for containing transfer sheets cut in different sizes. Paper feeder rollers 77 with fan-like cross sectional shapes are disposed at front ends of the paper supply cassettes 75 and serve to supply image transfer sheets 76 one sheet at a time from a selected one of the cassettes 75. Nearly at the center of the main body 70 is a pair of pressure rollers 80 and 81. The lower pressure roller 81 is supported by a supporting table 82 which is biased upward by a spring 83 such that the two pressure rollers 80 and 81 remain in a mutually compressing condition. In FIG. 12, P2 indicates a pressure point at which the two pressure rollers 80 and 81 compress each other. FIG. 12 also shows that the holder plate 65 extends from the lower pressure roller 81 towards the take-up shaft 7 so as to conveniently guide the front end of the photosensitive sheet to the take-up shaft 7.

In FIG. 12, the inserted cartridge is generally indicated at 100 and is disposed somewhat in the left-hand part of the main body 70. Opposite to the roller 6 inside the cartridge 100, there is a delivery roller 90 disposed such that the photosensitive sheet 4 is pulled out of the cartridge between this internal roller 6 and the delivery roller 90. A transportation route for the photosensitive sheet 4 is established between the outlet opening (shown at 5 in FIG. 1) of the cartridge and the aforementioned pressure point P2 as more fully illustrated in FIG. 13.

As shown more clearly and with reference to FIG. 13, the aforementioned delivery roller 90 opposite from the internal roller 6 of the cartridge 100 is rotatably supported by an arm 110 which, in turn, is supported rotatably around an axis 111. This arm 110 is connected at its end point distal from the axis 111 to one end of another (right-hand) arm 115 by means of a pin 114. This right-hand arm 115 is also rotatably supported at its right-hand end around an axis 116, and the pin 114 through which the two arms 110 and 115 connected is biased upward by a spring 113 and is also connected to the actuator of a solenoid 112. Numerals 117 and 119 indicate rollers supported by the right-hand arm 115 so as to be opposite from two rollers 118 and 120 affixed to the main body 70. The main body 70 also provides a sheet-like transportation plate 121 opposite to the arms 110 and 115 and additional transportation plates 122 leading from the position of the rollers 119 and 120 diagonally downward. Another roller 138 is provided at the lower end of these plates 122.

When the solenoid 112 is switched off as shown in FIG. 13, the arms 110 and 115 are lifted up around their supporting axes 111 and 116, respectively, by the biasing force of the spring 113, causing the rollers 90, 117 and 119 attached thereto to be likewise lifted up to be separated from the rollers 6, 118, and 120 opposite therefrom. If the solenoid 112 is switched on, however, the arms 110 and 115 move downward around their respective supporting axes 111 and 116, causing the rollers 90, 117 and 119 to contact their associated rollers 6, 118, and 120. The solenoid 112 is switched on after the cartridge 10 is set to the main body and when the front end of the photosensitive sheet 4 is wrapped around the take-up shaft 7 of the cartridge. The solenoid 112 is adapted to remain in the OFF condition at other times. In other words, the rollers 90, 117 and 119 are normally kept away from the upper (microcapsule-coated) surface of the photosensitive sheet 4 to prevent them from damaging the microcapsules. In FIG. 12, numeral 130 indicates a cartridge detector sensor disposed below and to the left of the cartridge 100 which is switched on when the cartridge 100 is mounted to the main body 70.

As shown in FIG. 12, an opening is provided near the middle of the transportation plates 122 such that the reflected light from the document 72 can be made incident on the photosensitive sheet 4 passing therethrough. P1 indicates the exposure point at which the photosensitive sheet 4 is exposed to this image forming beam of light. To the left of the pressure point P2 are a sheet detector sensor 131 for detecting the photosensitive sheet 4 and a guide roller 132 for transporting the photosensitive sheet 4. The aforementioned mechanism for operating the holder plates 65 to be directed toward the take-up shaft 7 is also disposed here. A predetermined length of time after the sheet detector sensor 131 detects the front edge of the incoming photosensitive sheet 4, the solenoid 112 is switched off. This predetermined length of time represents the time interval required for the front edge of the photosensitive sheet 4 to become wrapped around the take-up shaft 7 of the cartridge.

At the pressure point P2, the photosensitive sheet 4 and a image transfer sheet 76 superimpose one on top of the other and pressed together such that image development and transfer are carried out as is well known in the art of printing by rupturable capsules (for example, U.S. Pat. No. 4,624,560). After this compression process, the photosensitive sheet 4 is transported by the aforementioned guide roller 132 and, guided by the holder plates 65 as explained above, is wrapped around the take-up shaft 7. In the meantime, the image transfer sheet 76 is carried away to the left by a conveyor belt 133 disposed on the left-hand side of the pressure point P2. Further to the left of the conveyor belt 133 are heat rollers 134, discharge rollers 135 and a discharge tray 136. The heat rollers 134 serve to accelerate the chromogenic reaction on the image transfer sheet 76. If the surface of the image transfer sheet 76 is covered with a transparent thermoplastic resin as disclosed in U.S. Pat. No. 4,554,235 (Japanese Patent Publication Tokkai No. 60-259490), the resin is melted and serves to produce a lustrous image. Numeral 138 in FIG. 12 indicates a fan disposed on the left-hand side of the cartridge 100.

When a cartridge 100 is newly mounted in the main body 70, this is detected by the cartridge detector sensor 130, and when the front cover 30 is closed thereafter, this is detected by the front cover detector sensor 74. When the cartridge detector sensor 130 and the front cover detector sensor 74 make their respective detection, the solenoid 112 is switched on and each of the rollers begins to rotate. The gears 15-17 on the back frame 2 of the cartridge 100 (shown in FIG. 3) are thereby operated and the photosensitive sheet 4 begins to be unwound from its roll 14. As explained above, the front part of the photosensitive sheet 4 which comes out first is the leader section made of a somewhat still material not coated with microcapsules. This leader section is initially pulled out of the cartridge 100 by the rollers 90, 6, 117, 118, 119 and 120 along the transportation plates 121 and 122, passing the exposure point P1 and the pressure point P2. The roller 138 at the lower end of the transportation plates 122 is also driven at the same time.

A predetermined time period after the front end of the photosensitive sheet 4 passes the pressure point P2 and reaches the position of the sheet sensor 131, the motor stops and the solenoid 112 is switched off, setting the transportation route in the condition shown in FIG. 13. By this time, the front edge of the photosensitive sheet 4 has passed the sheet sensor 131, advanced along the holder plates 65 and reached the position of the take-up shaft 7. The front part of the photosensitive sheet 4, pushed by the holder plates 65, is attached to the adhesives 8 and wrapped around the take-up shaft 7. In other words, the front part of the photosensitive sheet 4 is already attached to the adhesives 8 by the time it is wrapped around the take-up shaft 7. Thus the subsequently transported part of the photosensitive sheet 4 can be dependably wrapped around the take-up shaft 7. After the motor is thus stopped and the solenoid 112 is switched off as explained above, the image formation apparatus finds itself in a standby condition. Since the length of the aforementioned leader section (10–20 cm) is so determined that a microcapsule-coated part of the photosensitive sheet 4 is at the exposure point P1 when its front edge is already wound around the take-up shaft 7, the apparatus in this standby condition is ready to start an image formation process.

If a print switch (not shown) is pressed when the apparatus is in the aforementioned standby condition, the optical system 73 scans the document 72 and its image is made incident at the exposure point P1. The motor is started simultaneously to transport the photosensitive sheet 4 and an image transfer sheet 76 from a cassette. When the photosensitive sheet 4 is exposed at the exposure point P1 to the image forming light, those of the microcapsules thereon which are exposed to light are hardened while those not exposed to light remain soft. In other words, an invisible image, or a pattern, is formed on the photosensitive sheet 4 by selectively hardened microcapsules. At the pressure point P2, the photosensitive sheet 4 now carrying thereon a selectively hardened invisible image and an image transfer sheet 76 are pressed together to rupture soft microcapsules for development and transfer. The colorless dye flowing out of the ruptured microcapsules react chromogenically with the developer material of the image transfer sheet 76. Thereafter, the used photosensitive sheet 4 is passed by the transportation roller 132 along the holder plates 65 to the take-up shaft 7 while the image transfer sheet 76, now carrying a visible image thereon, is transported by a conveyor belt 133 to the heat rollers 134 which serve not only to accelerate the chromogenic reaction but also to add luster to the image by melting a thermoplastic resin material if the image transfer sheet 76 is coated with such a material. The heated transfer sheet 76 is thereafter discharged through the discharge rollers 135 onto the discharge tray 136 to complete a cycle of image formation process.

As many cycles of image formation process are repeated, the diameter of the roll 14 inside the box 1 of the cartridge 100 becomes smaller while that of the roll of used photosensitive sheet wrapped around the take-up shaft 7 becomes larger. FIG. 15 shows a situation when the roll 14 of the photosensitive sheet has been partially consumed. When the roll 14 in the box is completely used up, it is time to replace the cartridge 100 with a new one. For this purpose, the front cover 30 is opened to the front as explained above and the cartridge cover 51 is also opened to the frontal direction, causing the holder plates 65 to rotate downward as shown in FIG. 11B such that the cartridge 100 can be freely pulled out of the main body 70. FIG. 16 shows the view when the roll 14 is completely used up and both the front cover 30 and the cartridge cover 51 are opened to the front.

The manner in which the front part of the photosensitive sheet 4 is wrapped around the take-up shaft 7 is explained next by way of FIGS. 17 and 18A–18C. As explained above, the solenoid 112 is switched on and the motor is started when the cartridge 100 is set and both the cartridge cover 51 and the front cover 30 are closed. From this moment on, the front end of the photosensitive sheet 4 is pulled out of the box 1 and reaches the take-up shaft 7. After the front end of the photosensitive sheet 14 passes the pressure point P2, it is guided by the holder plates 65 as shown in FIG. 18A and approaches the take-up shaft 7 in the direction of the arrow. Since the holder plates 65 are engaged with the grooves 9 on the take-up shaft 7 as shown in FIG. 17, the front end of the photosensitive sheet 4, as soon as it reaches the position of the take-up shaft 7, is dependably contacted to its circumference as shown in FIG. 18B. As the photosensitive sheet 4 is further sent in, its front end contacts the adhesive sections 8 (provided at four places according to the illustrated embodiment) and becomes affixed to them as shown in FIG. 18C. In other words, if the photosensitive sheet 4 is still further sent in, its front end is already attached to the take-up shaft 7 and hence it does not slip away from the intended transportation route. In summary, with the help of the adhesive sections 8 and the holder plates 65, the photosensitive sheet 4 can be dependably and securely wrapped around the take-up shaft 7 when the cartridge 100 is initially set and the holder plates 65 served to cause the used photosensitive sheet to be tightly wrapped around.

The foregoing description of a preferred embodiment with the invention has been presented for purposes of illustration and description. It is not intended to be exhaustive or to limit the invention to the precise form disclosed, and many modifications and variations are possible in light of the above teaching. For example, FIGS. 19–21 show another embodiment of the present invention characterized by a flexible partition piece 150 which may comprise a black resinous film, cloth or paper and separates the box 1 from the take-up shaft 7. As can be more clearly understood from FIGS. 20 and 21, this flexible partition piece 150 is intended to gradually invade the space originally occupied by the roll 14 of unused photosensitive sheet as the photosensitive sheet is used and the diameter of the roll 14 of the unused part diminishes while that of the roll around the take-up shaft 7 grows. In summary, the cartridge shown in FIGS. 19–21 has the advantage that the space inside the image formation apparatus can be more efficiently utilized and hence the image formation apparatus can be more compactly designed. The present invention discloses an image formation apparatus with a cartridge with a box for containing a roll of unused photosensitive sheet and a unistructurally formed take-up shaft for wrapping it around such that the user is no longer required to discard each used photosensitive sheet after each copying operation nor is any shredder or the like required. The work of the user becomes lighter and the image formation apparatus need not be made large. Since adhesive sections are provided on the take-up shaft, furthermore, the front end of the photosensitive sheet to be taken up need only to touch the take-up shaft to be securely and dependably wrapped therearound. Although the holder plates 65 are shown in FIG. 9 as being operated by the opening and closing of the cartridge cover 51, the cartridge cover 51 is not an essential component of the present invention. Alternatively, a motion-communicating relationship may be established between the holder plates 65 and some other cover such as the front cover 30. Any modifications and variations of that may be apparent to a person skilled in the art are intended to be included within the scope of this invention.

What is claimed is:

1. An image formation apparatus comprising
a detachably attached cartridge having a box containing a roll of photosensitive sheet therein and a take-up shaft unistructurally formed with said box for winding up used part of said photosensitive sheet therearound, and
holding means for guiding said used part of said photosensitive sheet towards said take-up shaft and for pressing against said take-up shaft.

2. The image formation apparatus of claim 1 wherein said take-up shaft has grooves formed thereon.

3. The image formation apparatus of claim 1 wherein said cartridge also has a flexible partition piece separating said box and said take-up shaft.

4. An image formation apparatus comprising
a detachably attached cartridge having a box containing a roll of photosensitive sheet therein and a take-up shaft unistructurally formed with said box for winding up used part of said photosensitive sheet therearound,
a cover for said cartridge, and
sheet holding means in motion-communicating relationship with said cover so as to be pressed against said take-up shaft when said cover is closed and to be separated from said take-up shaft when said cover is opened.

5. The image formation apparatus of claim 4 wherein said take-up shaft has grooves formed thereon such that said sheet holding means engage in said grooves when said sheet holding means are pressed against said take-up shaft.

6. The image formation apparatus of claim 4 wherein said sheet holding means are so disposed as to cause said used part of said photosensitive sheet to pass between said take-up shaft and said holding means.

7. The image formation apparatus of claim 2 wherein said grooves are formed circumferentially around said take-up shaft.

8. The image formation apparatus of claim 7 wherein said holding means include two elongated pieces extending in the direction of motion of said photosensitive sheet towards said take-up shaft.

9. The image formation apparatus of claim 8 wherein said grooves are formed at longitudinal positions along said take-up shaft where said two elongated pieces reach said take-up shaft.

10. The image formation apparatus of claim 1 wherein said holding means is biased so as to be pressed against said take-up shaft.

* * * * *